United States Patent [19]

Watanabe et al.

[11] Patent Number: 4,918,561
[45] Date of Patent: Apr. 17, 1990

[54] HOUSING FOR ELECTRONIC APPARATUS

[75] Inventors: Hiroshi Watanabe, Hitachi; Yoshiaki Takahashi, Mito; Masayuki Sakata, Takahagi; Koshirou Adachi, Tokorozawa; Jushi Ide, Mito; Atsuo Yoshida, Kokubunji, all of Japan

[73] Assignees: Hitachi, Ltd, Tokyo; Hitachi Process Computer Engineering, Inc., Hitachi, both of Japan

[21] Appl. No.: 254,224

[22] Filed: Oct. 6, 1988

[30] Foreign Application Priority Data

Oct. 12, 1987 [JP] Japan .................. 62-254553

[51] Int. Cl.[4] .............................................. H65K 7/20
[52] U.S. Cl. .................. 361/384; 165/80.3; 361/383
[58] Field of Search ............ 98/1, 36; 168/80.3, 168/104.33; 124/16.1, 16.2; 361/383, 384, 390

[56] References Cited

U.S. PATENT DOCUMENTS

| 4,291,471 | 9/1981 | Bloom | 98/36 |
| 4,489,363 | 12/1984 | Goldberg | 174/16.1 |
| 4,790,080 | 12/1988 | Detzer et al. | 98/36 |

FOREIGN PATENT DOCUMENTS 59-114900 3/1984 Japan .

Primary Examiner—Gregory D. Thompson
Attorney, Agent, or Firm—Antonelli, Terry & Wands

[57] ABSTRACT

A housing for accomodating an electronic apparatus including heat-generating parts, in which the surface of a cooling air inlet port in the front or rear side of the housing is formed in arcuate fashion and recessed as viewed from the interior of the housing. As a result, the velocity of air introduced is remarkably reduced thereby improving the heat radiation of the housing.

4 Claims, 10 Drawing Sheets

HOUSING FOR ELECTRONIC APPARATUS

BACKGROUND OF THE INVENTION

The present invention relates to a housing for an electronic apparatus accomodating an electronic unit inclnding heat-generating parts, and more particularly, to a housing for an electronic apparatus having an improved cooling air intake port thereof.

A typical apparatus using such a housing is an electronic computer comprising a plurality of high heat-generating elements.

A conventional cooling construction for a frame of an electronic apparatus is disclosed in JP-A-58-114900.

A frame 1 of an electronic apparatus corresponding to a housing to which the present invention is directed, as shown in FIG. 1, has a front door 2 thereof curved in arcuately protruded form. About one half part of the door is provided with an air inlet port 3 to facilitate the intake of the cool air, so that the air flow between the room and the frame of the electronic apparatus is improved thereby improving the heat rediation of the circuit blocks.

In this conventional system, the flow of the cooling air in the room is considered to be limited to a single direction indicated by arrows as shown in FIG. 2.

Generally, an electronic computer has an air inlet port in the front part of the door, and the air sucked in is divided into right and left paths in the housing and discharged from an exhaust port formed in the ceiling. The aforementioned conventional housing, which is used with a small apparatus and performs its function sufficiently with slits formed in the door, is not employed in the field of computer.

The CLASSIC series of computer of MODCOMP and Model MV/10000 of ECLIPSE, and HIDIC80/E computer of Hitachi, for example, has a flat surface of air inlet port.

The prior-art housing construction described above pays no special attention to the reduction in the velocity of intake air and the noises produced by the blower fan. These problems are posed against the strong cooling system of a large-sized computer which tends to an increasingly great amount of heat.

Specifically, the reduction in the size of apparatuses is a very important factor for marketing, and therefore it is necessary to reduce the size of the air inlet space as far as possible.

In order to maintain the reliability of the apparatus, on the other hand, the control of a temperature increase below a certain level is required. For the purpose of covering the high heat generation of an apparatus, therefore, a blower fan with a great air-blowing capacity is required. The noise of the blower fan reaches as high a level as 80 dB. Further, the cooling air driven by this blower fan reaches a velocity of 8 to 10 m/sec on the surface of a heat-generating part and 3 to 5 m/sec even on the air inlet port thereby creating two problems problems.

Firstly, a high air velocity on the inlet port causes paper or the like to attach to the inlet port and reduces the air intake area of the inlet port, thus decreasing the cooling air capacity. Secondly, in spite of the fact that noises of a blower fam may be reduced to 60 dB by arranging a noise-absorbing material appropriately, direct noises remain unabsorbed. The noise-absorbing material thus has its own limit. Because of the short distance between the noise source and the inlet port, on the other hand, the energy attenuation is so small as to make it impossible to reduce the noise level to the order of 55 dB as required for a residential space. Further improvements are thus required.

SUMMARY OF THE INVENTION

Accordingly, the primary object of the present invention is to improve the heat radiation of a housing for an electronic apparatus.

Another object of the invention is to facilitate the drawing of the cooling air into a housing for an electronic apparatus.

In order to achieve these objects, there is provided according to the present invention a housing for an electronic apparatus, in which the surface of an air inlet port for introducing the cooling air formed in the front or rear surface of the housing is formed in arcuate form in such a manner that the housing has internal concave parts.

DESCRIPTION OF THE PREFERRED EMBODIMENTS

Preferred embodiments of the present invention will now be described in conjunction with the accompanying drawings, in which.

DESCRIPTION OF THE PREFERRED EMBODIMENTS

Figure 1:
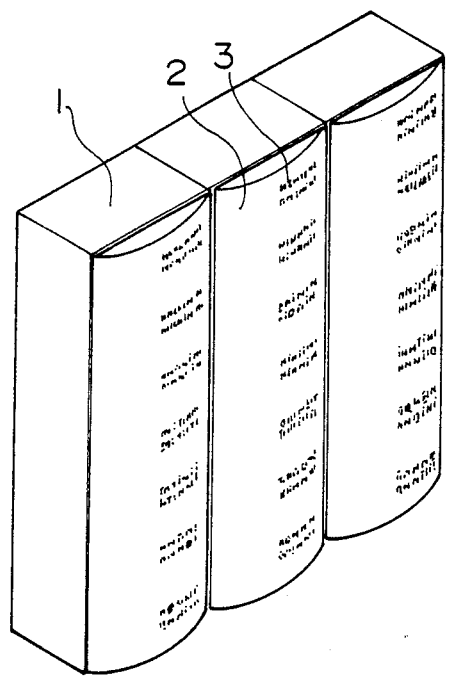
FIG. 1 is a perspective view of a conventional housing for an electronic apparatus.
Figure 2:
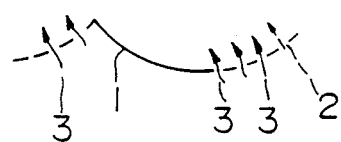
FIG. 2 is a diagram showing the principle of application of the housing shown in FIG. 1.
Figure 3A:
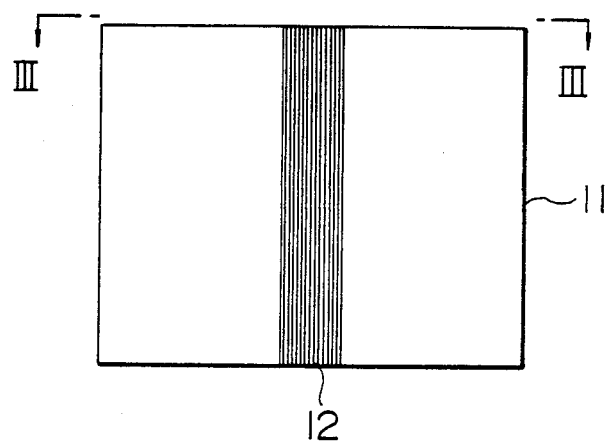
FIG. 3A is a front view showing a basic configuration of the present invention.
Figure 3B:
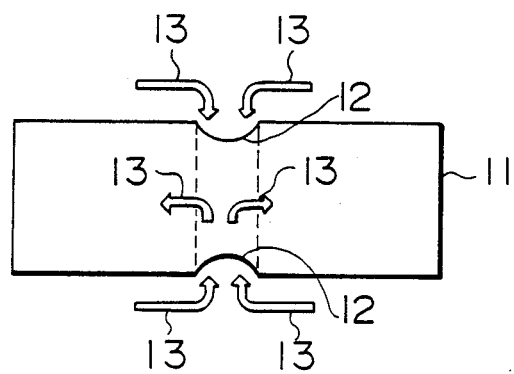
FIG. 3B is a schematic diagram taken along the line III—III in FIG. 3A.

As shown in FIGS. 3A and 3B, and electronic apparatus housing 11 has an arcuate air inlet port 12 formed in concave form at the central part of the front and rear surfaces in the housing 11. The cooling air 13 is adapted to branch into the right and left parts in the housing as shown by arrows in FIG. 3B.

Figure 4A:
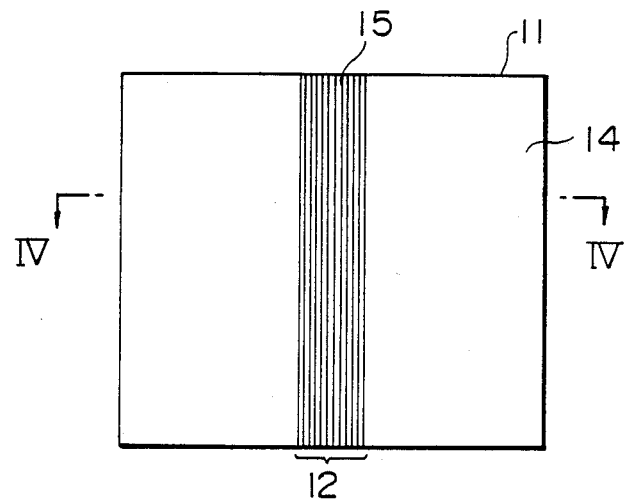
FIG. 4A is a side view of an air inlet port in slit form according to the present invention.
Figure 4B:
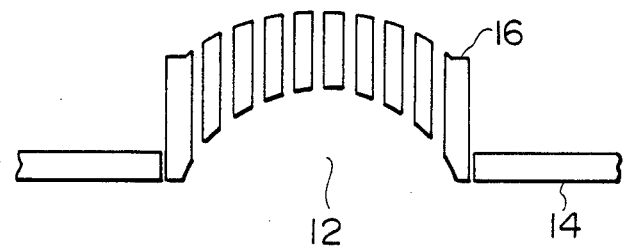
FIG. 4B is a sectional view taken along the line IV—IV in FIG. 4A.

In FIGS. 4A and 4B, the inlet port 12 is located at substantially the central part of an exterior panel 14, and is so shaped as to have flat slits 15 having a predetermined thickness arranged perpendicularly to the panel 14, and parallel to each other.

Figure 5A:
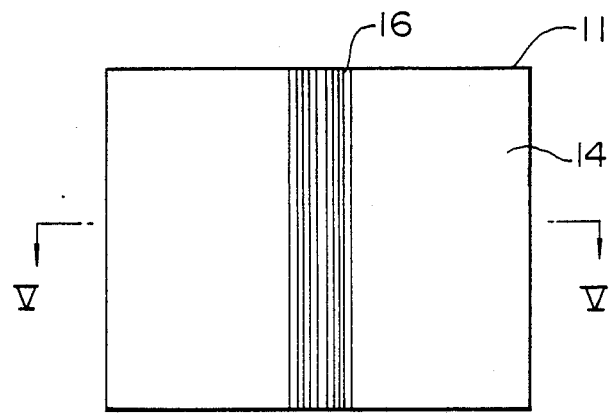
FIG. 5A is a side view of an air inlet port in slit form according to another embodiment of the present invention.
Figure 5B:
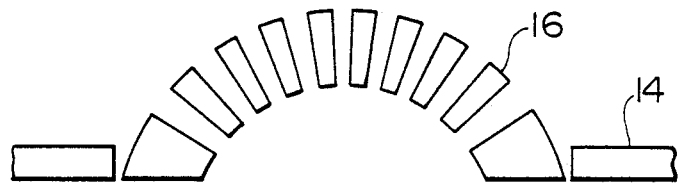
FIG. 5B is a sectional view taken along the line V—V in FIG. 5A.

The embodiment of FIGS. 5A and 5B differs from the embodiment of FIGS. 4A and 4B by virtue of the fact that a plurality of slits 16 are arranged in a radial direction from a center of the inlet port, and the cooling air drawn into the housing can be branched into the right and left portions of the housing with less resistance than in the case of the embodiments of FIGS. 4A and 4B.

Figure 6:
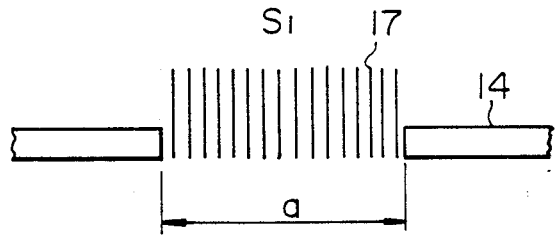
FIG. 6 is a diagram showing a style of a flat inlet port according to the prior art.
Figure 7:
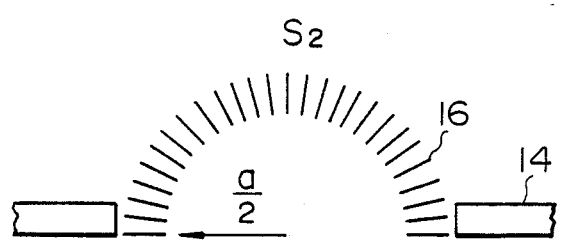
FIG. 7 is a diagram showing a style of an arcuate inlet port according to the present invention.

To compare the flat inlet area of a conventional construction shown in FIG. 6 with the arcuate inlet port area of the present invention in FIG. 7, the slits 16 and 17, which have an actual thickness of 2 to 7 mm, are assumed to be zero in thickness for convenience sake, and the width of the inlet port 17 as a and the inlet area per unit length as $S_1$ as shown in FIG. 6. Then, the inlet area $S_2$ per unit length in FIG. 7 is given as $$S_2 = \frac{\pi}{2} S_1 \qquad (1)$$

Thus, $S_2/S_1 = 1.57 \qquad (2)$

Actually, however, the difference is not as much as 57% since the thickness of the slits 16, 17 is added. Nevertheless, the inlet area can be increased by about 20% to 30%. When converted into the inlet air velocity, this is equivalent to 3.0 to 3.3 m/sec for the arcuate slots if the velocity for the flat slots is assumed to be 4 m/sec.

Figure 8A:
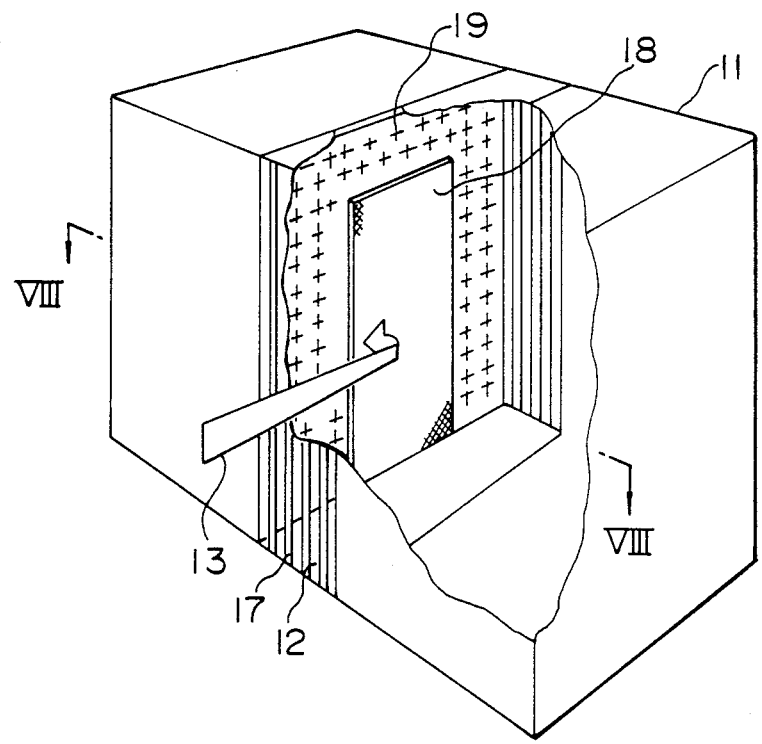
FIG. 8A is a schematic perspective view of an internal style of an inlet port according to the present invention.

To analyze noises which are generated, as shown in FIG. 8A, the housing, which has an air inlet port 12, passes the cooling air in the direction of arrow 13. A fan or blower fan generally makes up a noise source, which is mounted in the housing on both sides of the inlet port 12. The inlet port has therein an air filter 18 in the path to the right and left housing portions, and a noise-absorbing material 19 attached on the other parts.

Figure 8B:
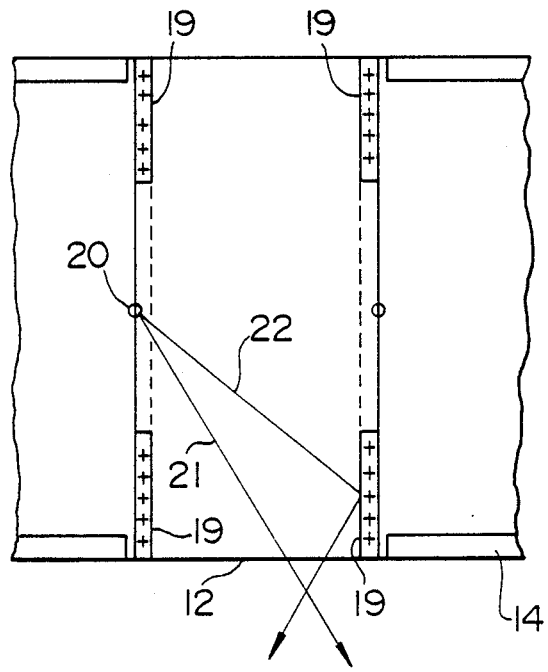
FIG. 8B is a sectional view taken along the line VIII—VIII in FIG. 8A.

In FIG. 8B a noise source (such as a fan) is located at a position designated by numeral 20 with noises being released outside of the housing through two main routes, namely, a direct noise 21, and a reflected noise 22. Generally, the reflected noise 22 is about 3 dB lower than the direct noise 21. The noise reflected on the noise-absorbing material 19 is futher reduced in level. In other words, the reduction in the level of the reflected noise 22 is an important factor for overall noise reduction.

Figure 9:
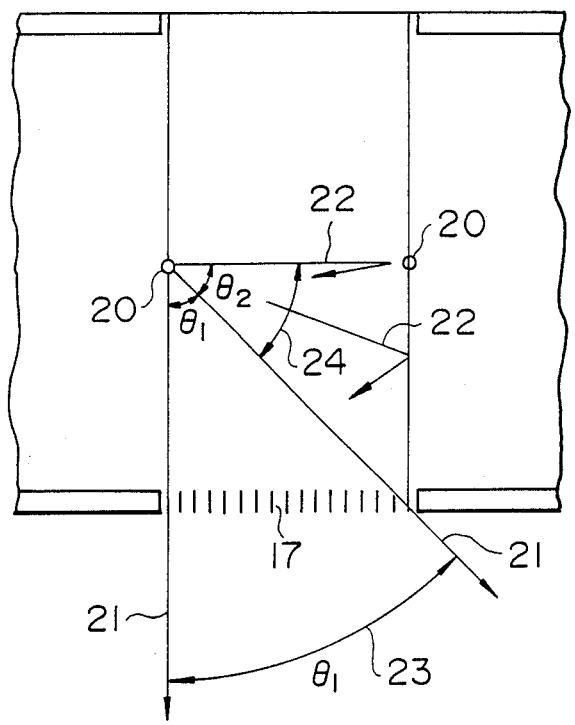
FIG. 9 is a diagram showing the direct noise of a flat inlet port according of a conventional arrangement.
Figure 10:
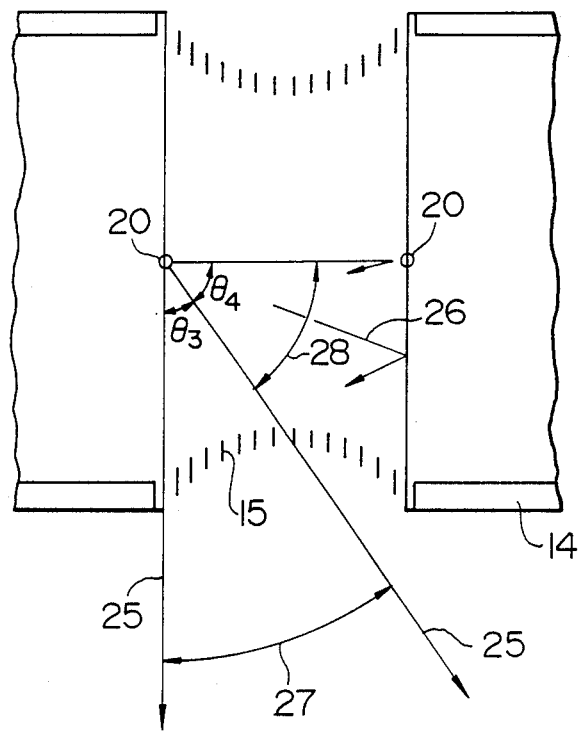
FIG. 10 is a diagram showing the direct noise of an arcuate inlet port according to the present invention.

FIGS. 9 and 10 show a comparison between the direct noises caused in the flat inlet port according to the prior art and that caused in an arcuate inlet port according to the present invention. FIG. 9 shows a flat inlet port, in which the direct noise 23 exists at an angle of $\theta_1$, with reflected noise 22 existing at an angle $\rho_2$. In the case of the arcuate inlet port shown in FIG. 10, on the other hand, the direct noise 25 is represented by an angle $\theta_3$ ($\theta_1 > \theta_3$) due to the depth and arcuate form of the slits 15, with the reflected noise 26 being represented by the angle $\rho_4$. In the latter case, as seen from FIG. 10, the area of the direct noise 25 is reduced almost by one half as compared with the flat form shown in FIG. 9.

Figure 11:
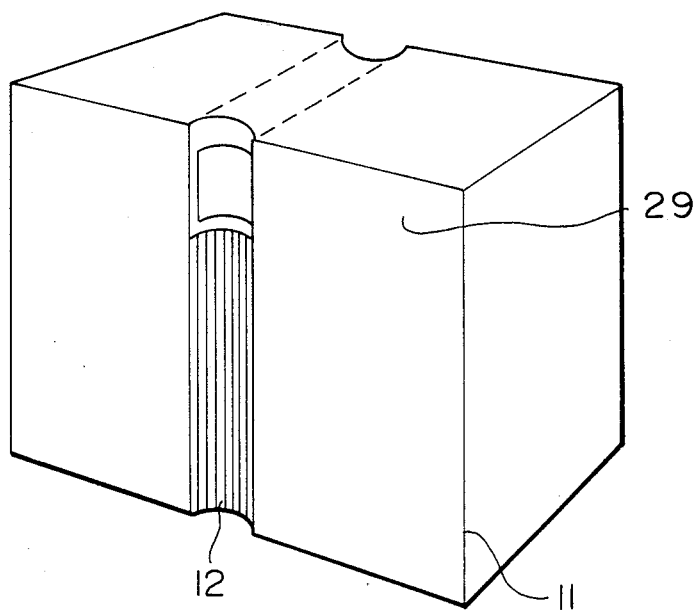
FIG. 11 is a schematic perspective view of an embodiment of the present invention.

In accordance with the present invention, as shown in FIG. 11, a housing for an electronic apparatus (equivalent to an electronic computer) has an inlet port 12 at the central part thereof, and accomodates heat-generating parts in the right and left parts of the housing. An openable console case 29 for the operator has switches and input/output units built therein. Also, the inlet port 12 is arcuate in shape, and has a plurality of slits in such a form as shown in FIG. 4 or 5.

It will thus be understood from the foregoing description that according to the present invention with air inlet port in arcuate form instead of flat form as in the prior art, the intake air velocity is reduced by 20% to 30% and the direct noise by about one half, respectively, as compared with the prior art.

We claim:

1. A housing for accommodating an electronic apparatus including heat-generating parts, the housing comprising a cooling air inlet means formed on at least one of a front side and a rear side of the housing for enabling a flow of cooling air to enter the housing to cool the heat generating parts accommodated therein, said cooling air inlet means having noise absorbing means disposed therein and including an inlet port, said inlet port formed in an arcuate fashion curving inwardly toward an interior of the housing wherein an intake air velocity is reduced by said inlet port and noise generated by a noise source disposed in the housing is reduced by said noise absorbing means.

2. A housing for accommodating an electronic apparatus including heat-generating parts, the housing comprising a cooling air inlet means having noise absorbing means disposed therein and including an inlet port, said inlet port formed at a front central portion of the housing in an arcuate fashion curving inwardly toward an interior of the housing for enabling a flow of cooling air to enter the housing to cool the heat-generating parts accommodated therein, and wherein the inlet port is constructed such that the cooling air introduced through the inlet means branches into a right portion and left portion of the housing wherein an intake air velocity is reduced by said inlet port and noise generated by a noise source disposed in the housing is reduced by said noise absorbing means.

3. A housing for an electronic apparatus according to claim 1, wherein the inlet port includes a plurality of flat slits arranged in parallel to each other along a depth of the housing.

4. A housing for an electronic apparatus according to claim 1, wherein the inlet port includes a plurality of slits arranged radially of a center of the inlet port along a depth of the housing.

* * * * *